(12) United States Patent
Chiu et al.

(10) Patent No.: US 7,259,034 B2
(45) Date of Patent: Aug. 21, 2007

(54) SELF-ALIGNMENT MANUFACTURING METHOD OF THE MICROLENS AND THE APERTURE USING IN OPTICAL DEVICES

(75) Inventors: Yi Chiu, Hsinchu (TW); Wen Syang Hsu, Hsinchu (TW); Yu-Ru Chang, Wanli Township, Taipei County (TW)

(73) Assignee: National Chiao Tung University, Hsinchu (TW)

( * ) Notice: Subject to any disclaimer, the term of this patent is extended or adjusted under 35 U.S.C. 154(b) by 381 days.

(21) Appl. No.: 11/052,875

(22) Filed: Feb. 9, 2005

(65) Prior Publication Data

US 2006/0134814 A1    Jun. 22, 2006

(30) Foreign Application Priority Data

Dec. 17, 2004   (TW) .............................. 93139311 A (51) Int. Cl.
    *H01L 21/00*     (2006.01)
(52) U.S. Cl. .............................. 438/29; 438/22; 438/48
(58) Field of Classification Search ............ 438/22–29, 438/48–52; 257/98, 294
    See application file for complete search history.

(56) References Cited

U.S. PATENT DOCUMENTS

| 5,811,322 | A | * | 9/1998 | Robinson ..................... 438/92 |
| 6,055,220 | A | | 4/2000 | Mamin et al. |
| 6,335,522 | B1 | | 1/2002 | Shimada et al. |
| 6,441,359 | B1 | | 8/2002 | Cozier et al. |
| 6,721,262 | B1 | | 4/2004 | Jordache et al. |

\* cited by examiner

*Primary Examiner*—Dung A. Le
(74) *Attorney, Agent, or Firm*—Rosenberg, Klein & Lee (57) ABSTRACT

The present invention discloses a self-alignment manufacturing method of a microlens and an aperture using in an optical device. The method manufactures the aperture and the circular opening in the opaque film on a transparent substrate, and utilizes the self-alignment backside exposure technology to precisely integrate the aperture and the microlens made by macromolecule material without any combination step. The claimed method is simpler than conventional technology and can precisely align and integrate the microlens and the aperture with a continuous batch manufacture. Since the aperture and the circular opening are concentric circles and formed in same step, the microlens and the aperture can be precisely aligned with the backside exposure. The claimed invention can effectively improve the optical resolution and efficiency of the optical access and measurement devices.

10 Claims, 12 Drawing Sheets

SELF-ALIGNMENT MANUFACTURING METHOD OF THE MICROLENS AND THE APERTURE USING IN OPTICAL DEVICES

BACKGROUND OF INVENTION

1. Field of the Invention

The invention relates to an integrated structure of the microlens and the aperture using in optical devices, and more particularly, to a precisely self-alignment manufacturing method of the microlens and the aperture with the backside exposure process.

2. Description of the Prior Art

In the optical access or optical measurement equipments, the alignment issue between the microlens and the aperture always causes the difficulty of manufacture. Moreover, the efficiency of these equipments is also diminished by the misalignment between the microlens and the aperture.

There are several manufacturing method of the microlens and the aperture using in the conventional optical devices. The method disclosed in U.S. Pat. No. 6,335,522 is that the Aperture/Probe and the solid immersion lens (SIL) are separately manufactured on two substrates, and then the combination technology is utilized to connect two substrates and finish the device. With this method, a misalignment is probably produced, and the procedure is very complex with high manufacture cost and technology threshold. Besides, this method cannot finish the whole structure in a continuous process.

The U.S. Pat. No. 6,721,262 disclosed the manufacturing method of the aperture. The aperture is defined by the high-resolution equipments, such as Electro Beam or Focus Ion Beam, and then SIL is connected to the aperture with adhesive. This method also probably produces misalignment in the connection procedure, and the equipment for forming apertures is expensive. The manufacture threshold is high.

The manufacturing method disclosed in U.S. Pat. No. 6,441,359 is that the integrated structure of the probe and SIL is micro-manufactured with batch type, and a continuous process, not the combining process, accomplishes the integration of the probe and SIL. But the probe and SIL in this method are defined in two different steps, so this method also has the problem of misalignment.

The method disclosed in U.S. Pat. No. 6,055,220 is that the aperture is directly formed on the bottom of SIL. But the aperture and SIL in this method are separately defined in different steps, so this method also has the problem of misalignment. Beside, there is no manufacturing method of SIL disclosed in this document.

Hence, the present invention utilized the self-alignment technology to integrate the microlens and the aperture to overcome the problem of misalignment produced in the manufacturing procedure.

SUMMARY OF INVENTION

It is therefore a primary objective of the claimed invention to provide a self-alignment manufacturing method of a microlens and an aperture using in an optical device that the microlens and the aperture can be precisely aligned with self-alignment technology, and the integration structure can be continuously batch-finished without any combining procedure or high-resolution equipments.

It is therefore another objective of the claimed invention to provide a self-alignment manufacturing method of a microlens and an aperture using in an optical device that the integration structure of the microlens and the aperture can be applied to the optical access or optical measurement equipments to effectively improve the optical resolution and efficiency and reduce the optical aberration.

It is therefore a further objective of the claimed invention to provide a self-alignment manufacturing method of a microlens and an aperture using in an optical device that the conventional semiconductor or micro electromechanical technology can be utilized to accomplish the continuous batch process without any combination or connection procedure. The general equipment and process can be utilized to perform the claimed method, so the manufacture threshold can be effectively lowered.

According to the claimed invention, an opaque film is formed on a transparent substrate or a transparent substrate with sacrificed layer, and the aperture and the circular opening are formed in this opaque film. Then, the macromolecule material for making the microlens is formed to cover the transparent substrate and the opaque film. The backside exposure is performed with the opaque film and a mask, and a macromolecule material structure self-aligning the aperture is defined with the lithograph process. Finally, the macromolecule material structure is heated to the glass transition temperature to form the microlens. Hence, the microlens and the aperture can be precisely aligned and integrated by using the backside exposure technology.

These and other objectives of the present invention will no doubt become obvious to those of ordinary skill in the art after reading the following detailed description of the preferred embodiment that is illustrated in the various figures and drawings.

| | | | |
|---|---|---|---|
| 10 | transparent substrate | 12 | sacrificed layer |
| 14 | pattern | 16 | opaque film |
| 18 | initial aperture | 20 | circular opening |
| 22 | pattern | 24 | thin-film material |
| 26 | nanometer aperture | 28 | macromolecule material |
| 30 | exposed area | 32 | mask |
| 34 | exposed area | 36 | cylindrical macromolecule material structure |
| 38 | microlens | | |
| 42 | conductive layer | 40 | pattern |
| 46 | mask | 44 | metal film |

DETAILED DESCRIPTION

The present invention discloses a self-alignment technology that can simply and precisely align and integrate the microlens and the aperture, so the misalignment between the microlens and the aperture can be effectively overcome. Furthermore, in the application of the optical access device, because of the precise alignment of the microlens and the aperture, the efficiency of the optical system can be improved and the optical aberration can be also reduced.

Several embodiments that can manufacture the integrated structure of the microlens and the aperture are disclosed hereunder. With these embodiments, the microlens and the aperture can be aligned and integrated by the self-alignment technology without any connection procedure, and can be manufactured with continuous batch type.

EMBODIMENT 1

Figure 1A:
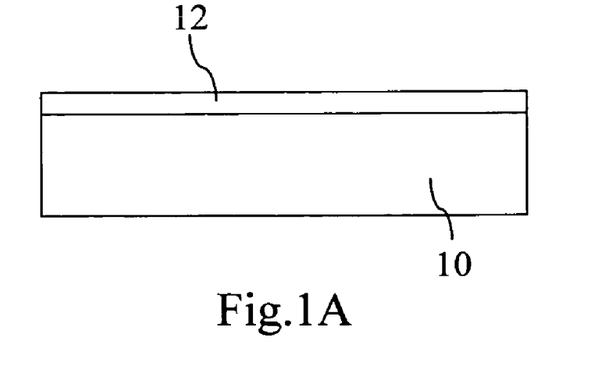
FIGS. 1A to 1C are cross-sectional views of the steps of manufacturing the aperture according to the embodiment 1.
Figure 1B:
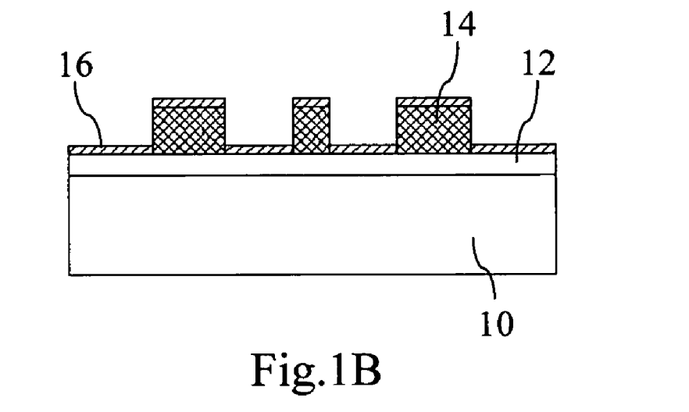
Figure 1C:
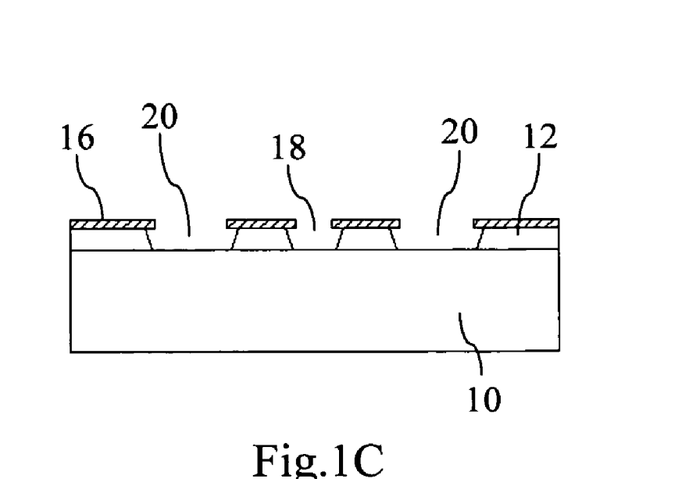

In this embodiment, as shown in FIGS. 1A to 1C, the aperture is formed by the lift-off process of the micro electromechanical technology. Then, the deposition technology, such as the sputter process, is used to shrink the aperture to nanometer class. In addition, the microlens is manufactured with the lithograph process, backside exposure process and thermal reflowing process. Since the backside exposure technology has a feature of self-alignment, the microlens and the aperture can be precisely integrated, as shown in FIGS. 2A to 2G.

First of all, as shown in FIG. 1A, a sacrificed layer 12, such as Cr in 2 μm, is deposited on a transparent substrate 10. This sacrificed layer 12 is used for the integration structure of the microlens and the aperture to conveniently depart from the transparent substrate. Then, the lithograph technology is used to define a pattern 14 on the sacrificed layer 12, and an opaque film 16, such as Ti in 0.2 μm, is deposited as shown in FIG. 1B. As shown in FIG. 1C, the lift-off process of the micro electromechanical technology is utilized to manufacture patterns of an initial aperture 18 and a circular opening 20 on the opaque film 16. The opaque film 16 is used as mask in the backside exposure process, and an undercut process is performed on the sacrificed layer 12 under the initial aperture 18 and the circular opening 20 to etch portions of sacrificed layer 12 and expose the transparent substrate 10 under the circular opening 20.

Figure 2A:
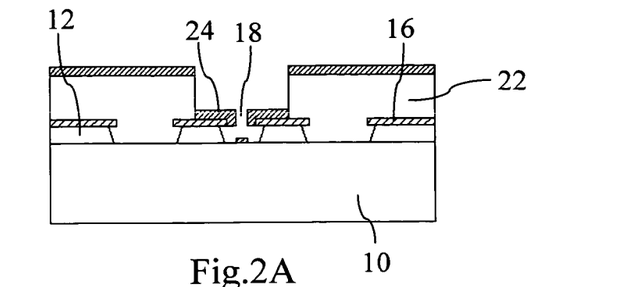
FIGS. 2A to 2G are cross-sectional views of the steps of manufacturing the microlens according to the embodiment 1 and the embodiment 2.
Figure 2B:
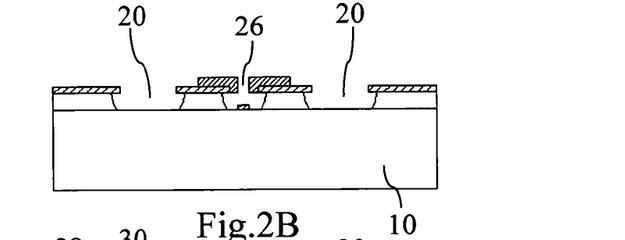
Figure 2C:
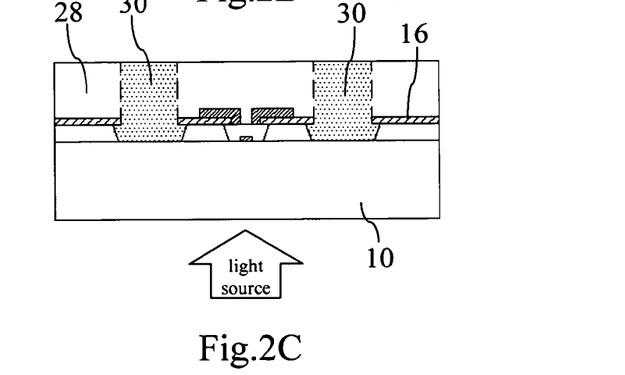
Figure 2D:
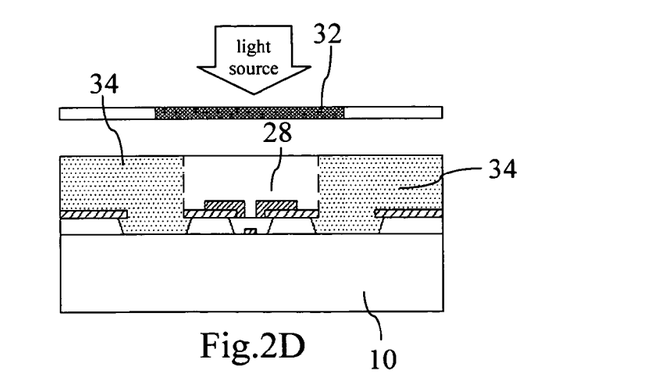
Figure 2E:
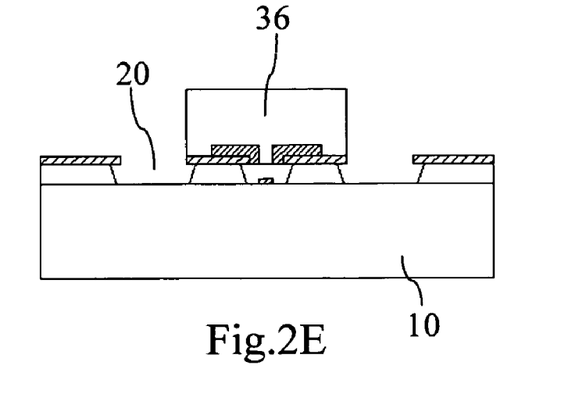
Figure 2F:
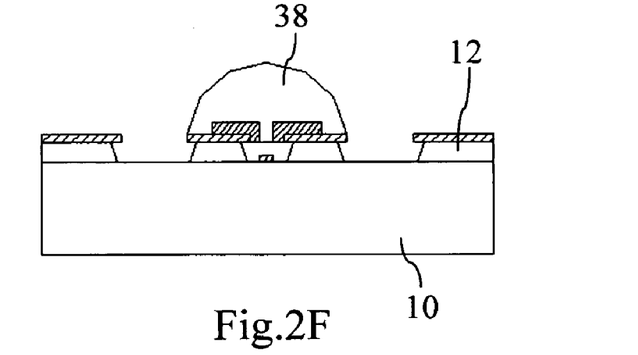
Figure 2G:
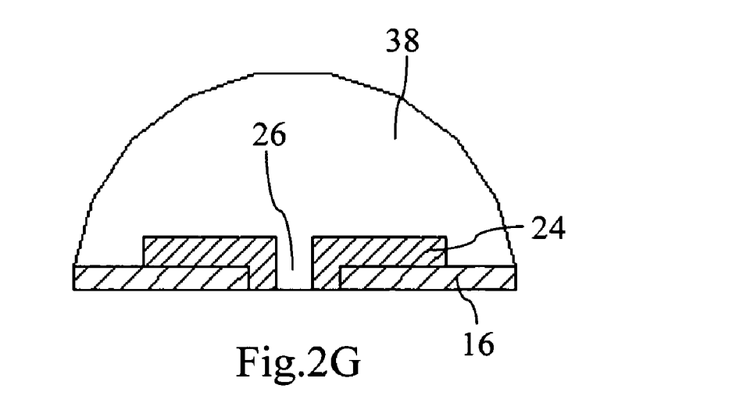

Then, as shown in FIG. 2A, a pattern 22 is defined by the lithograph process. Then, a deposition process, such as sputter process, is used to form a thin-film material 24, such as Ti, on the opaque film 16 and the pattern 22, and size of the initial aperture 18 in FIG. 1C can be shrunk into the nanometer class. Later, the pattern 22 and the thin film material 24 thereon are removed, and a nanometer aperture 26 can be formed, as shown in FIG. 2B. The macromolecule material 28 for manufacturing the microlens is covered on the whole transparent substrate 10 by spin coating, as shown in FIG. 2C. Then, the opaque film 16 is used as mask to perform the backside exposure. In the backside exposure process, the light source passes through the macromolecule material 28 via the circular opening 20 and makes portions of the macromolecule material 28 forming an exposed area 30. After the backside exposure, a lithography process is directly performed with mask 32, as shown in FIG. 2D, and the macromolecule material 28 is exposed again with the mask 32 to make the exposed area 30 transforming into the exposed area 34. Then, the macromolecule material 28 within the exposed area 34 is removed, and a cylindrical macromolecule material structure 36 made by the macromolecule material 28 is obtained, as shown in FIG. 2E. As shown in FIG. 2F, the cylindrical macromolecule material structure 36 is heated to the glass transition temperature (Tg) and forms the microlens 38 structure with the thermal reflowing process. Finally, the sacrificed layer 12 is removed by the chemical wet etching process, and the integration structure of the microlens 38 and the nanometer aperture 26 is fully departed from the transparent substrate 10 to obtain the integration structure in FIG. 2G.

In this process, since both the initial aperture 18 and the circular opening 20 are concentric circles and are formed in same process step, they can be precisely aligned and integrated with utilizing the backside exposure process and the conventional problem of misalignment can be overcome.

EMBODIMENT 2

The difference between the embodiments 1 and 2 is the manufacture method of the aperture. In this embodiment, the aperture is accomplished with the lithograph process accompanying with the dry-etching process, such as reactive ion etching (RIE), as shown in FIGS. 3A to 3D. The following processes are similar to that of the embodiment 1 and the microlens is accomplished with the process shown in FIGS. 2A to 2G.

Figure 3A:
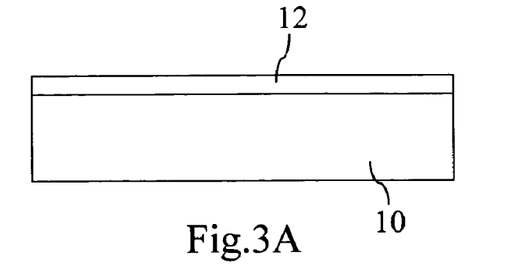
FIGS. 3A to 3D are cross-sectional views of the steps of manufacturing the aperture according to the embodiment 2.
Figure 3B:
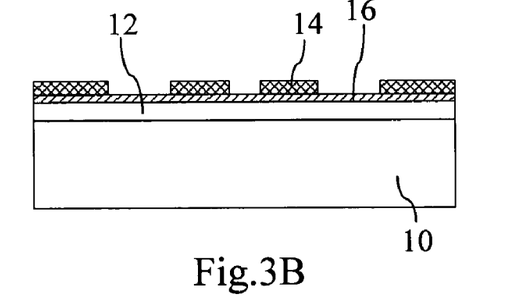
Figure 3C:
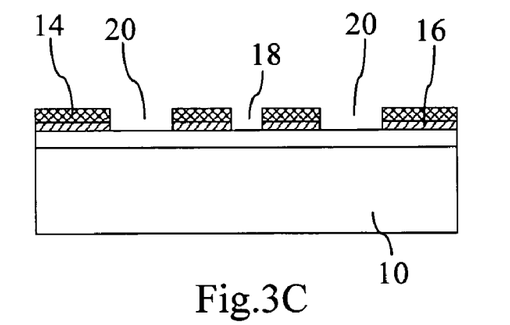
Figure 3D:
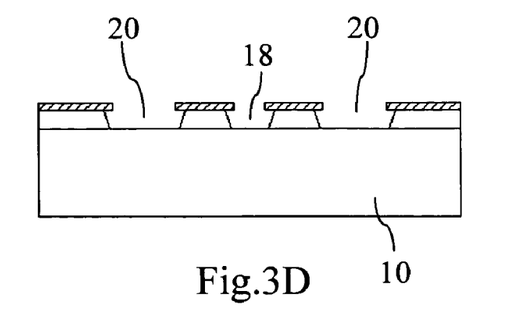

Firstly, as shown in FIG. 3A, a sacrificed layer 12, such as Cr in 2 μm, is deposited on a transparent substrate 10. This sacrificed layer 12 is used for the integration structure of the microlens and the aperture to conveniently depart from the transparent substrate. Then, a deposition process, such as sputter process, is used to form an opaque film 16, such as Ti in 0.2 μm, on the sacrificed layer 12 as shown in FIG. 3B. The lithograph technology is used to define a pattern 14 on the opaque film 16. The dry-etching process, such as RIE, is then used to define an initial aperture 18 and a circular opening 20 in the opaque film 16, as shown in FIG. 3C. This opaque film 16 is used as mask in the backside exposure process. After removing the pattern 14, the sacrificed layer 12 under the initial aperture 18 and the circular opening 20 is etched, and the transparent substrate 10 below the initial aperture 18 and the circular opening 20 is exposed, as shown in FIG. 3D.

The following processes are similar to that of the embodiment 1, and can refer to procedures in FIGS. 2A to 2G.

EMBODIMENT 3

Figure 4A:
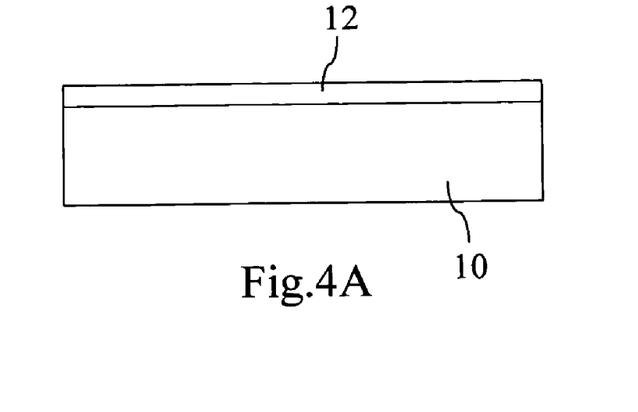
FIGS. 4A to 4C are cross-sectional views of the steps of manufacturing the aperture according to the embodiment 3.
Figure 4B:
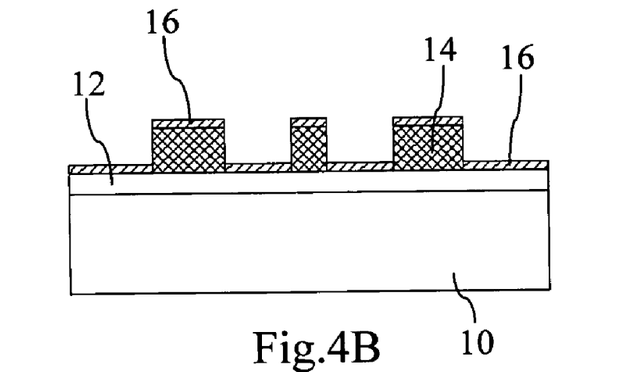
Figure 4C:
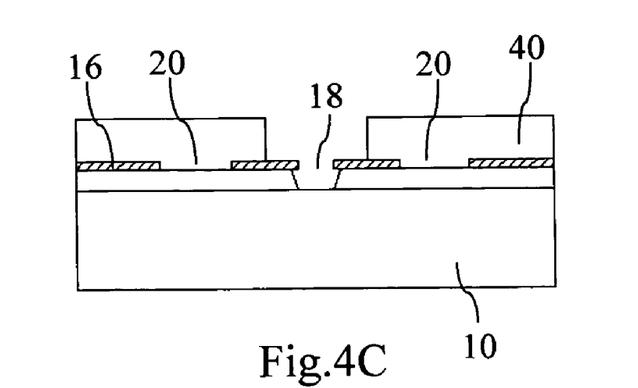

The embodiment 3 utilizes the lift-off process of the micro electromechanical technology to manufacture the aperture, as shown in FIGS. 4A to 4C. The similar deposition technology, such as the electroplate process, is used to shrink the aperture to the nanometer class. Then, the lithograph process accompanying with the backside exposure and thermal reflowing process is used to manufacture the microlens, as shown in FIGS. 5A to 5H. Since the process is accomplished by the backside exposure and self-alignment technology, the microlens and the aperture can be align and integrate precisely.

First of all, as shown in FIG. 4A, a sacrificed layer 12, such as Cr in 2 μm, is deposited on a transparent substrate 10. Then, the lithograph technology is used to define a pattern 14 on the sacrificed layer 12, and an opaque film 16, such as Ti in 0.2 μm, is deposited as shown in FIG. 4B. As shown in FIG. 4C, the lift-off process of the micro electromechanical technology is utilized to remove the pattern 14 and form an initial aperture 18 and a circular opening in the opaque film 16. The opaque film 16 is used as mask in the backside exposure process. Then, the lithograph process is used to define the pattern 40, and the sacrificed layer 12 under the initial aperture 18 is etched.

Figure 5A:
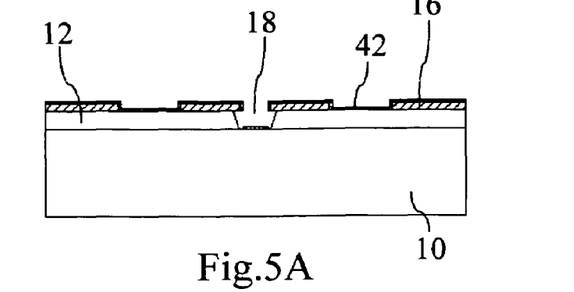
FIGS. 5A to 5H are cross-sectional views of the steps of manufacturing the microlens according to the embodiment 3 and the embodiment 4.
Figure 5B:
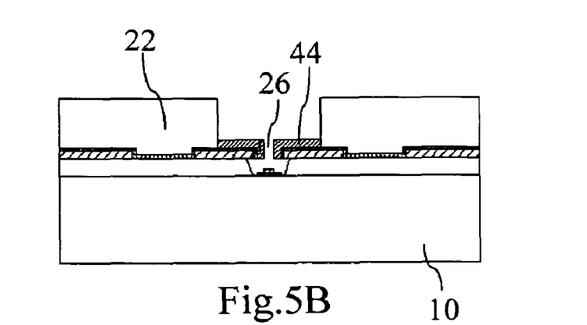
Figure 5C:
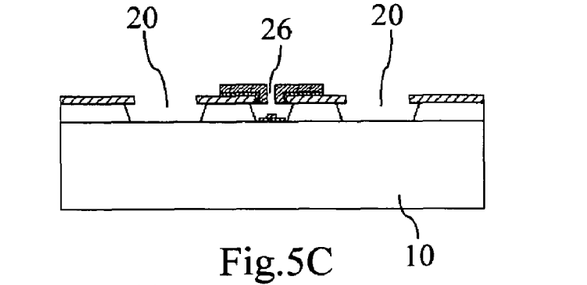

After removing the pattern 40, a conductive layer 42, such as Cu in 0.1 μm, is deposited on the structure of FIG. 5A. The lithograph process is used to define a pattern 22, and the deposition technology, such as the electroplate process, utilizes the conductive layer 42 as the electroplating beginning layer and deposits a metal film 44, such as Ni, on the conductive layer 42 as shown in FIG. 5B. The metal film 44 shrinks the initial aperture 18 to the nanometer class. After removing the pattern 22, a nanometer aperture 26 can be accomplished, as shown in FIG. 5C. Then, with the chemical wet etching process, the exposed conductive layer 42 and the sacrificed layer 12 below the circular opening 20 are etched, and the transparent substrate 10 under the circular opening 20 is exposed.

Figure 5D:
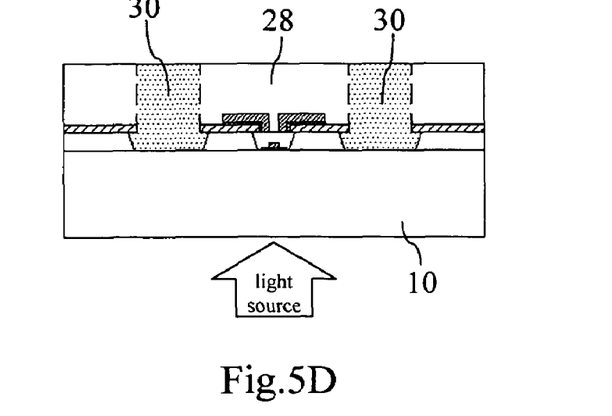
Figure 5E:
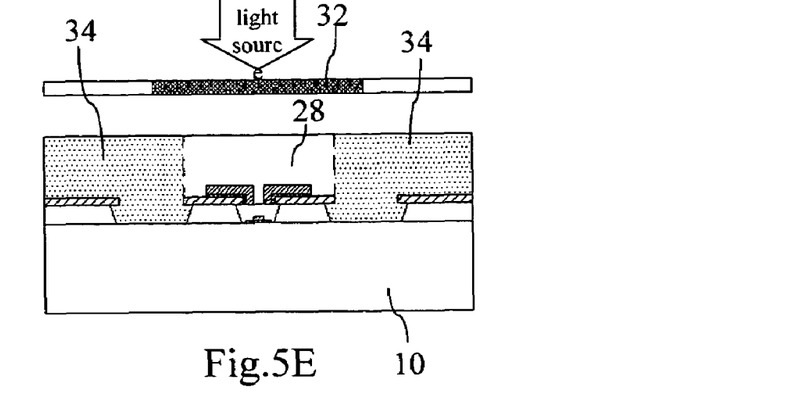
Figure 5F:
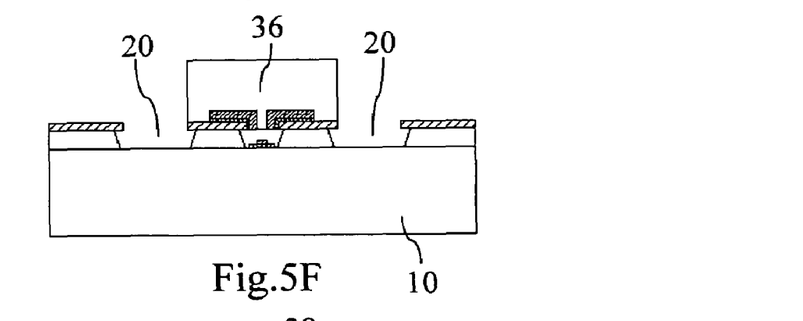
Figure 5G:
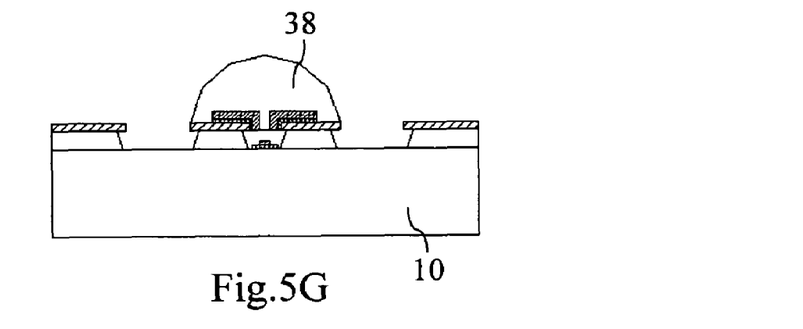
Figure 5H:
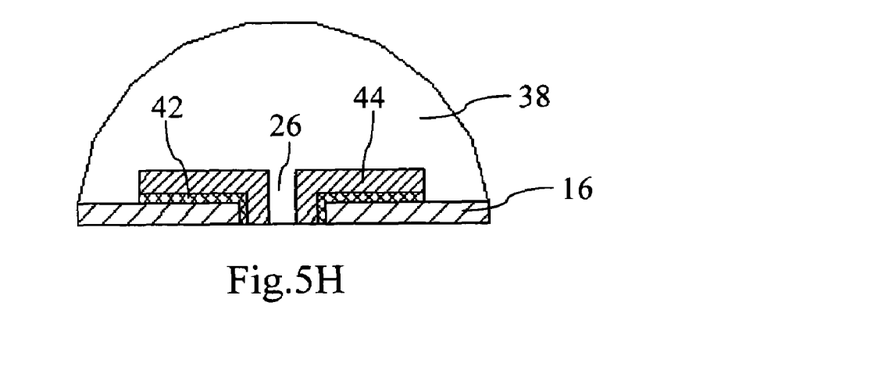

The macromolecule material 28 for manufacturing the microlens is covered on the whole transparent substrate 10 by spin coating, as shown in FIG. 5D. Then, the opaque film 16 is used as mask to perform the backside exposure. In the backside exposure process, the light source passes through the macromolecule material 28 via the circular opening 20 and makes portions of the macromolecule material 28 forming an exposed area 30. After the backside exposure, a lithograph process is directly performed with mask 32, and the macromolecule material 28 is exposed again with the mask 32 to make the exposed area 30 transforming into the exposed area 34, as shown in FIG. 5E. Then, the macromolecule material 28 within the exposed area 34 is removed, and a cylindrical macromolecule material structure 36 made by the macromolecule material 28 is obtained, as shown in FIG. 5F. As shown in FIG. 5G, the cylindrical macromolecule material structure 36 is heated to the glass transition temperature (Tg) and forms the microlens 38 structure with the thermal reflowing process. Finally, the sacrificed layer 12 is removed by the chemical wet etching process, and the integration structure of the microlens 38 and the nanometer aperture 26 is fully departed from the transparent substrate 10 to obtain the integration structure in FIG. 5H.

In this process, since both the initial aperture 18 and the circular opening 20 are concentric circles and are formed in same process step, they can be precisely aligned and integrated with utilizing the backside exposure process.

EMBODIMENT 4

The difference between the embodiments 3 and 4 is the manufacture method of the aperture. In this embodiment, the aperture is accomplished with the lithograph process accompanying with the dry-etching process, such as RIE, as shown in FIGS. 6A to 6D. The following processes are similar to that of the embodiment 3 and the microlens is accomplished with the process shown in FIGS. 5A to 5H.

Figure 6A:
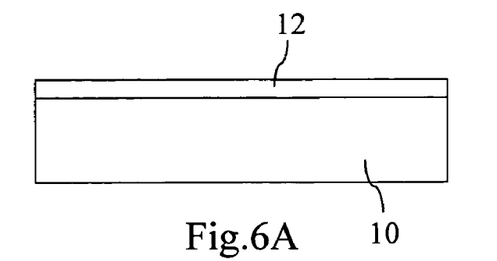
FIGS. 6A to 6D are cross-sectional views of the steps of manufacturing the aperture according to the embodiment 4.
Figure 6B:
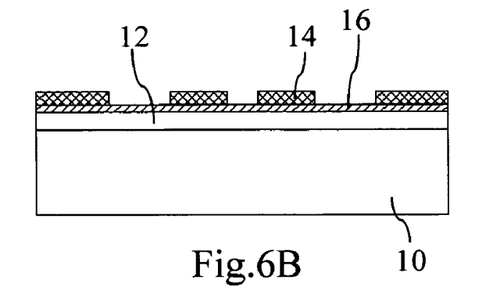
Figure 6C:
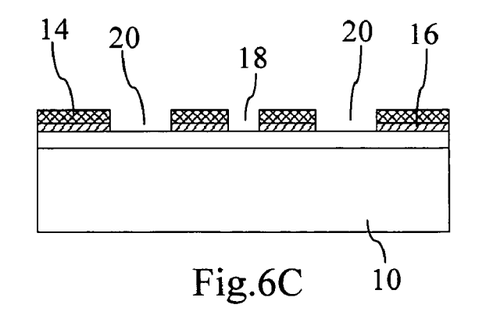
Figure 6D:
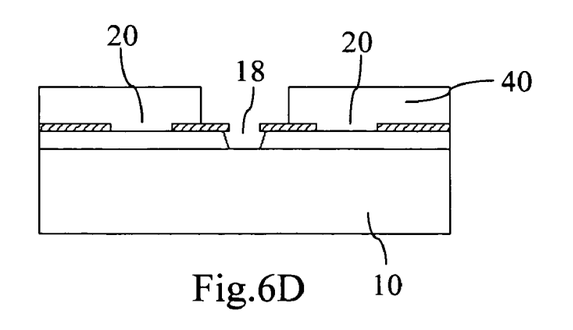

Firstly, as shown in FIG. 6A, a sacrificed layer 12 is deposited on a transparent substrate 10, and then a deposition process, such as sputter process, is used to form an opaque film 16, such as Ti in 0.2 μm, on the sacrificed layer 12 as shown in FIG. 6B. The lithography technology is used to define a pattern 14 on the opaque film 16. The dry-etching process, such as RIE, is then used to define an initial aperture 18 and a circular opening 20 in the opaque film 16, as shown in FIG. 6C. This opaque film 16 is used as mask in the backside exposure process. After removing the pattern 14, the lithograph process is used to define the pattern 40, as shown in FIG. 6D. Then the sacrificed layer 12 under the initial aperture 18 is etched.

The following processes are similar to that of the embodiment 3, and can refer to procedures in FIGS. 6A to 6H.

EMBODIMENT 5

Figure 7A:
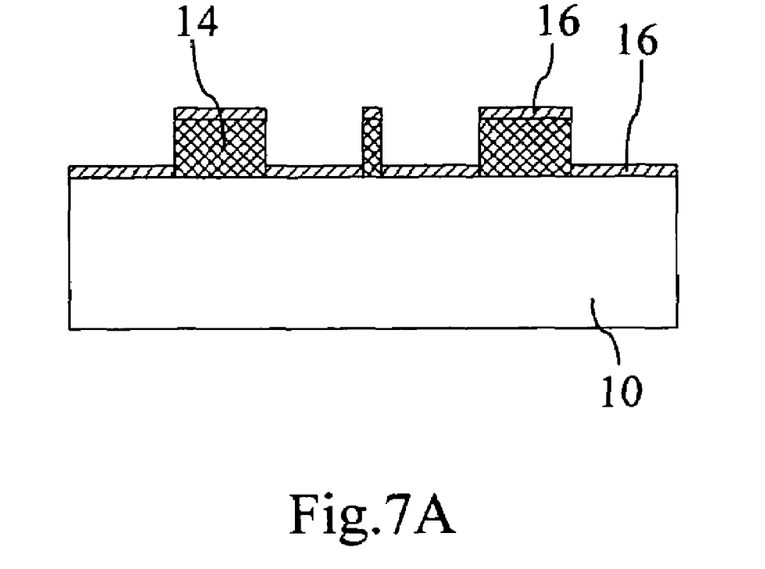
FIGS. 7A to 7B are cross-sectional views of the steps of manufacturing the aperture according to the embodiment 5.
Figure 7B:
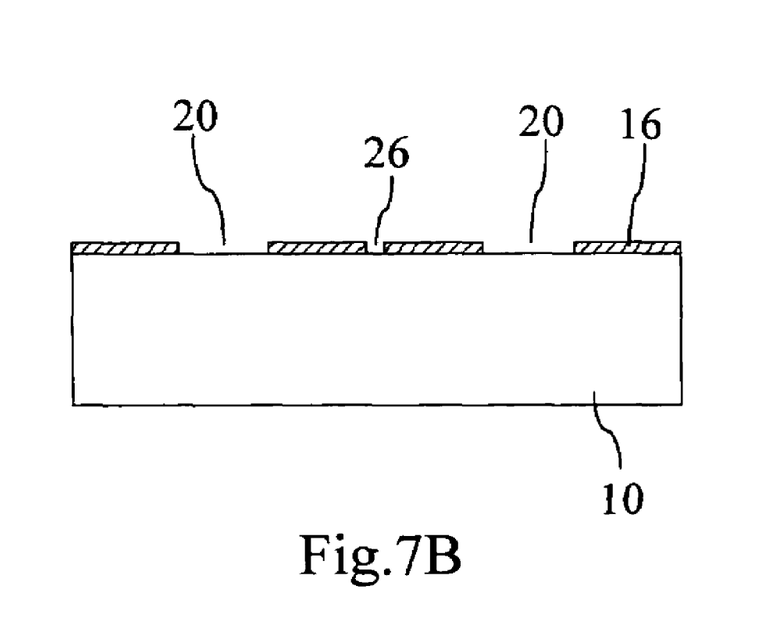

Similar to the embodiments 1 and 3, the embodiment 5 also utilizes the lift-off process of the micro electromechanical technology to manufacture the aperture, as shown in FIGS. 7A to 7B. The difference between this embodiment and embodiments 1 and 3 is that the nanometer aperture in this embodiment is directly defined by the high-resolution equipment, such as E-beam or deep UV equipments, to simplify the shrink procedure of the deposition process. Then, the lithograph process accompanying with the backside exposure and thermal reflowing process is used to manufacture the microlens and precisely align and integrate both the microlens and the aperture, as shown in FIGS. 8A to 8E. Since the nanometer aperture in this embodiment is directly defined by the high-resolution lithograph equipment without any shrinking procedure, the process of the nanometer aperture can be much simplified.

First of all, as shown in FIG. 7A, a pattern 14 is defined on the transparent substrate 10 by the high-resolution lithograph equipment, such as E-beam or deep UV equipments. Then an opaque film 16, such as Ti in 0.2 μm, is deposited on the transparent substrate 10 and the pattern 14. The lift-off process of the micro electromechanical technology is sequentially utilized to form an nanometer aperture 26 and a circular opening 20 in the opaque film 16, as shown in FIG. 7B. The opaque film 16 is used as mask in the backside exposure process.

Figure 8A:
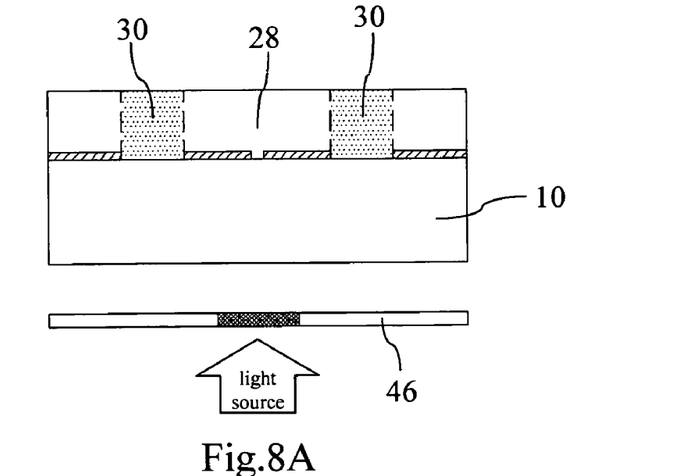
FIGS. 8A to 8E are cross-sectional views of the steps of manufacturing the microlens according to the embodiment 5 and the embodiment 6.
Figure 8B:
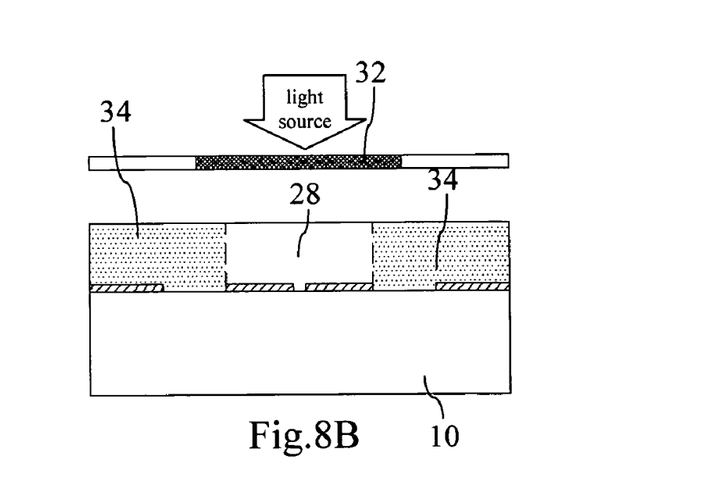
Figure 8C:
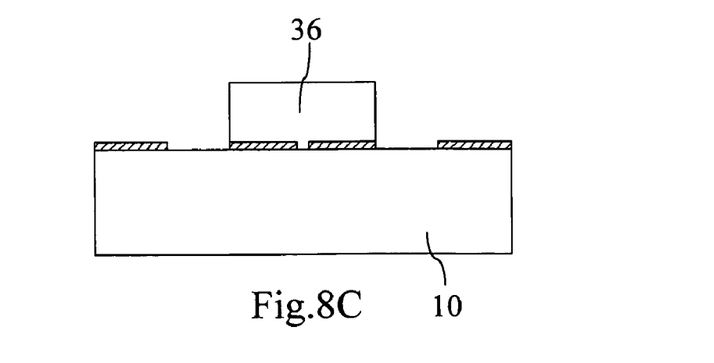
Figure 8D:
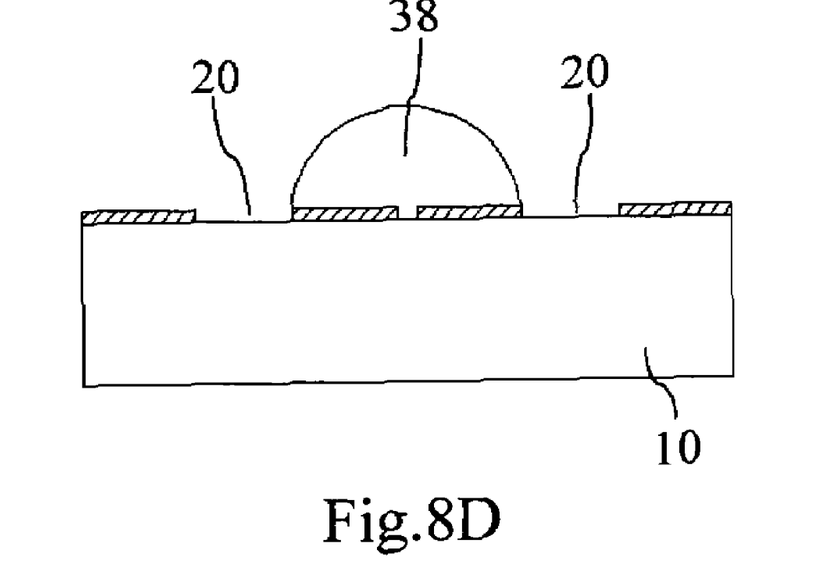
Figure 8E:
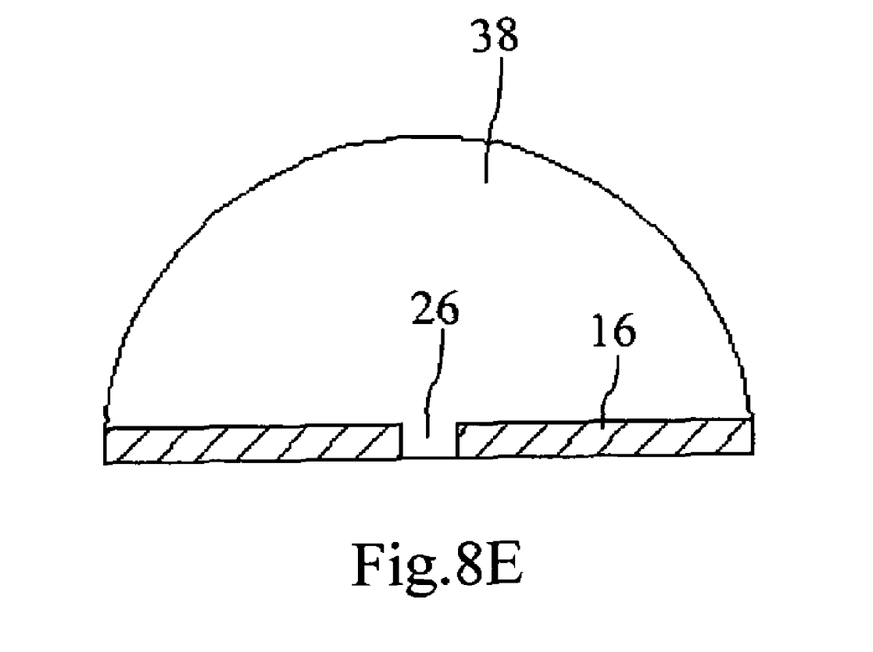

Then, the macromolecule material 28 for manufacturing the microlens is covered on the whole transparent substrate 10 by spin coating, as shown in FIG. 8A. The opaque film 16 and a mask 46 are used as mask to perform the backside exposure. In the backside exposure process, the light source passes through the macromolecule material 28 via the circular opening 20 and makes portions of the macromolecule material 28 forming an exposed area 30. After the backside exposure, a lithograph process is directly performed with mask 32, and the macromolecule material 28 is exposed again with the mask 32 to make the exposed area 30 transforming into the exposed area 34, as shown in FIG. 8B. Then, the macromolecule material 28 within the exposed area 34 is removed, and a cylindrical macromolecule material structure 36 made by the macromolecule material 28 is obtained, as shown in FIG. 8C. As shown in FIG. 8D, the cylindrical macromolecule material structure 36 is heated to the glass transition temperature (Tg) and forms the microlens 38 structure with the thermal reflowing process. Finally, the integration structure of the microlens 38 and the nanometer aperture 26 is fully departed from the transparent substrate 10 to obtain the integration structure in FIG. 8E.

In this process, since both the nanometer aperture 26 and the circular opening 20 are concentric circles and are formed in same process step, they can be precisely aligned and integrated together.

EMBODIMENT 6

Figure 9A:
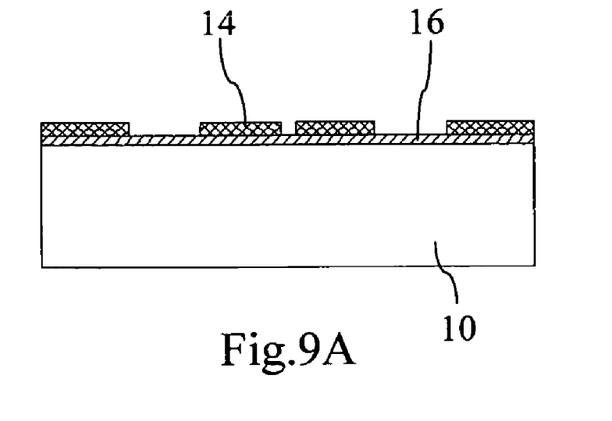
FIGS. 9A to 9C are cross-sectional views of the steps of manufacturing the aperture according to the embodiment 6.
Figure 9B:
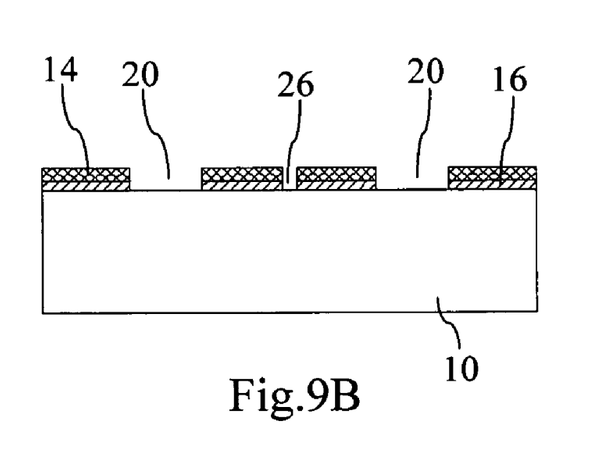
Figure 9C:
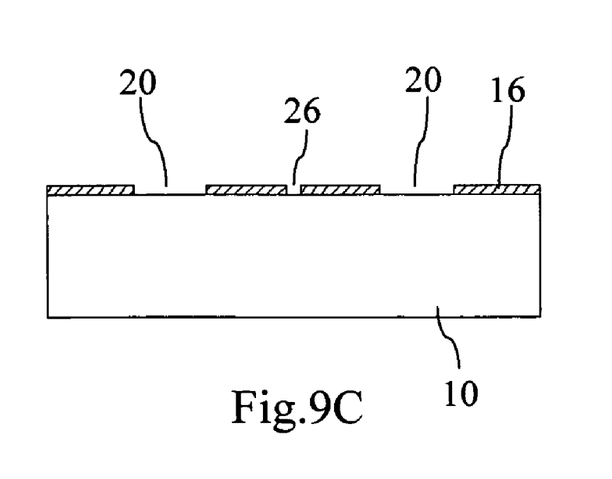

The difference between the embodiments 5 and 6 is the manufacture method of the nanometer aperture. In this embodiment, the nanometer aperture is accomplished with the high-resolution lithograph equipment, such as E-beam or deep UV equipments, accompanying with the dry-etching process, such as RIE, as shown in FIGS. 9A to 9C. The following processes are similar to that of the embodiment 5 and the microlens is accomplished with the process shown in FIGS. 8A to 8E.

Since the nanometer aperture in this embodiment is directly defined by the high-resolution lithograph equipment without any shrinking procedure, the process of the nanometer aperture can be much simplified. Firstly, as shown in FIG. 9A, an opaque film 16 is deposited on a transparent substrate 10, and a high-resolution lithograph equipment is utilized to define a pattern 14 on the opaque film 16. Then, the dry-etching process, such as RIE, is used to define a nanometer aperture 26 and a circular opening 20 in the opaque film 16, as shown in FIG. 9B. This opaque film 16 is used as mask in the backside exposure process. After removing the pattern 14, the nanometer aperture 26 and the circular opening 20 can be obtained, as shown in FIG. 9C.

The following processes are similar to that of the embodiment 5, and can refer to procedures in FIGS. 8A to 8E.

In the embodiments 5 and 6, for conveniently departing the integration structure of the microlens 38 and the nanometer aperture 26 from the transparent substrate 10, a sacrificed layer can be anticipatively formed on the transparent substrate 10, and then performing the following processes.

Hence, in the present invention, the microlens and the aperture can be precisely aligned and integrated with self-alignment technology, and the integration structure can be continuously batch-finished without any combining procedure. In addition, the integration procedure of the nanometer aperture and the microlens can be achieved without any high-resolution equipment. If the integration structure of the microlens and the aperture is applied to the optical access devices, the optical resolution and efficiency can be greatly improved, and the optical aberration can be also effectively reduced. Moreover, with the self-alignment technology, the microlens and the aperture can be precisely aligned and integrated, and can be manufactured with the general and conventional equipment and process, so the manufacture threshold can be effectively lowered.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A self-alignment manufacturing method of a microlens and an aperture using in an optical device, comprising steps of:

forming an opaque film on a transparent substrate, and forming at least one aperture and at least one circular opening outside the aperture on the opaque film; wherein the aperture and the circular opening are formed with lift-off technology or dry-etching;

forming a macromolecule material covering the transparent substrate and the opaque film;

performing a backside exposure on the transparent substrate using the opaque film as mask to expose the macromolecule material exposed from the circular opening;

forming an exposed area on the opaque film outside the circular opening with a lithography process to define a macromolecule material structure with specific shape; and heating the macromolecule material structure to a glass transition temperature to form the microlens, and the microlens self-aligns the aperture.

2. The self-alignment manufacturing method of claim 1 further comprising forming a sacrificed layer between the transparent substrate and the opaque film, and further comprising removing the opaque film under the aperture and the circular opening after forming the aperture and the circular opening to expose the transparent substrate.

3. The self-alignment manufacturing method of claim 1 or 2 further comprising removing the substrate or the sacrificed layer after forming the microlens.

4. The self-alignment manufacturing method of claim 1 further comprising a shrinking step to shrink the aperture to a nanometer aperture after forming the aperture.

5. The self-alignment manufacturing method of claim 4, wherein the shrinking step is performed by electroplating deposition or sputtering deposition technology.

6. The self-alignment manufacturing method of claim 1, wherein the aperture and the circular opening are concentric circles.

7. The self-alignment manufacturing method of claim 1, wherein when using the opaque film as mask to perform the backside exposure, the exposing light source passes through the transparent substrate, a portion of light source is retained by the opaque film, and another portion of light source passes through the circular opening to define the macromolecule material for removing the macromolecule material in the later lithography process to define a cylindrical macromolecule material structure.

8. The self-alignment manufacturing method of claim 1, wherein the aperture is a nanometer-class aperture directly defined by high-resolution lithography equipment, such as E-beam or Deep UV equipment.

9. The self-alignment manufacturing method of claim 1, wherein the macromolecule material is covered on the transparent substrate by spin coating.

10. The self-alignment manufacturing method of claim 1, wherein the step of backside exposure further uses a mask.

* * * * *